(12) United States Patent
Lee et al.

(10) Patent No.: US 8,569,084 B2
(45) Date of Patent: Oct. 29, 2013

(54) METHOD FOR FABRICATING LIGHT EMITTING DEVICE INCLUDING PHOTONIC CRYSTAL STRUCTURES

(75) Inventors: Jin Wook Lee, Seoul (KR); Sun Kyung Kim, Yongin-si (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/341,707

(22) Filed: Dec. 30, 2011

(65) Prior Publication Data

US 2012/0100645 A1    Apr. 26, 2012

Related U.S. Application Data

(63) Continuation of application No. 12/569,435, filed on Sep. 29, 2009, now abandoned.

(30) Foreign Application Priority Data

Mar. 3, 2009  (KR) .................. 10-2009-0017997

(51) Int. Cl.
*H01L 21/00* (2006.01)

(52) U.S. Cl.
USPC ............... 438/29; 438/706; 438/745; 257/98

(58) Field of Classification Search
None
See application file for complete search history.

(56) References Cited

U.S. PATENT DOCUMENTS

| | | | |
|---|---|---|---|
| 6,410,942 B1 | 6/2002 | Thibeault et al. | |
| 6,831,302 B2 * | 12/2004 | Erchak et al. | 257/87 |
| 2004/0206969 A1 | 10/2004 | Orita | |
| 2005/0205883 A1 | 9/2005 | Wierer et al. | |
| 2005/0221521 A1 | 10/2005 | Lee et al. | |
| 2006/0204865 A1 | 9/2006 | Erchak et al. | |
| 2007/0018187 A1 | 1/2007 | Lee et al. | |
| 2007/0257269 A1 | 11/2007 | Cho et al. | |
| 2007/0262330 A1 | 11/2007 | Lee et al. | |
| 2008/0035953 A1 | 2/2008 | Beom et al. | |
| 2008/0042149 A1 * | 2/2008 | Yoon et al. | 257/79 |

FOREIGN PATENT DOCUMENTS

| | | |
|---|---|---|
| EP | 1855327 A2 | 11/2007 |
| EP | 1858090 A2 | 11/2007 |
| KR | 10-2005-0092947 A | 9/2005 |
| KR | 10-0700993 B1 | 3/2007 |
| KR | 10-0762003 B1 | 9/2007 |
| KR | 10-0780233 B1 | 11/2007 |
| KR | 10-2007-0117336 A | 12/2007 |
| KR | 10-0816841 B1 | 3/2008 |
| KR | 10-2008-0093558 A | 10/2008 |
| WO | WO 01/41225 A2 | 6/2001 |

* cited by examiner

*Primary Examiner* — Evan Pert
*Assistant Examiner* — Andres Munoz
(74) *Attorney, Agent, or Firm* — Birch, Stewart, Kolasch & Birch, LLP

(57) ABSTRACT

A method for fabricating a light emitting device is provided. The method comprises forming a light emitting structure comprising a first conductivity type semiconductor layer, an active layer, and a second conductivity type semiconductor layer and forming a mixed-period photonic crystal structure on the light emitting structure. And the forming of the mixed-period photonic crystal structure includes defining a first photonic crystal structure through a lithography process and a dry etching process, and forming a second photonic crystal structure through a wet etching process.

10 Claims, 14 Drawing Sheets

METHOD FOR FABRICATING LIGHT EMITTING DEVICE INCLUDING PHOTONIC CRYSTAL STRUCTURES

CROSS-REFERENCE TO RELATED APPLICATIONS

This application is a Continuation of U.S. application Ser. No. 12/569,435 filed on Sep. 29, 2009 now abandoned, claiming the benefit of Korean Patent Application No. 10-2009-0017997 (filed on Mar. 3, 2009), which is hereby incorporated by reference for all purpose as if fully set forth herein.

BACKGROUND

The present disclosure relates to light emitting devices (LEDs) and a method for fabricating a light emitting device.

Light emitting devices (LEDs) are semiconductor devices that convert a current into light. After red LEDs was commercialized, red LEDs and green LEDs have been used as light sources for electronic devices including information communication devices.

For example, because a nitride semiconductor such as a gallium nitride (GaN) semiconductor has a high thermal stability and a wide band gap, it is being extensively researched in the field of photonic devices and high-power electronic devices. The research on a nitride semiconductor LED is being focused to improve the light emitting efficiency.

In terms of a semiconductor thin layer, the implementation of a high-efficiency LED requires a method for improving an internal quantum efficiency by increasing the probability of the radiative combination of electrons and holes injected into a light emitting layer, and a method for improving a light extraction efficiency so that the light formed in a light emitting layer is effectively outputted from the thin layer.

The improvement of the internal quantum efficiency requires a technology for growing a high-quality thin layer, and a technology for optimizing a thin layer lamination structure to maximize the quantum effect. For the improvement of the light extraction efficiency, Extensive research is being conducted to control the geometric shape of a semiconductor thin layer.

SUMMARY

Embodiments provide light emitting devices (LEDs) having a good light extraction efficiency.

In one embodiment, an LED comprises: a light emitting structure including a first conductivity type semiconductor layer, an active layer, and a second conductivity type semiconductor layer; and a mixed-period photonic crystal structure on the light emitting structure.

In another embodiment, an LED comprises: a light emitting structure including a first conductivity type semiconductor layer, an active layer, and a second conductivity type semiconductor layer; a conductive substrate under the light emitting structure; and a mixed-period photonic crystal structure on the conductive substrate.

In another embodiment, a method for fabricating a light emitting device (LED) comprises: forming a light emitting structure comprising a first conductivity type semiconductor layer, an active layer, and a second conductivity type semiconductor layer; and forming a mixed-period photonic crystal structure on the light emitting structure; wherein the forming of the mixed-period photonic crystal structure comprises: defining a first photonic crystal structure through a lithography process and a dry etching process; and forming a second photonic crystal structure through a wet etching process.

The details of one or more embodiments are set forth in the accompanying drawings and the description below. Other features will be apparent from the description and drawings, and from the claims.

DETAILED DESCRIPTION OF THE EMBODIMENTS

Light emitting devices (LEDs) according to embodiments will be described in detail with reference to the accompanying drawings.

In the description of embodiments, it will be understood that when a layer (or film) is referred to as being "on/over" another layer or substrate, it can be directly on/over another layer or substrate, or intervening layers may also be present. Further, it will be understood that when a layer is referred to as being "under/below" another layer, it can be directly under/below another layer, and one or more intervening layers may also be present. In addition, it will also be understood that when a layer is referred to as being "between" two layers, it can be the only layer between the two layers, or one or more intervening layers may also be present.

Embodiment 1

Figure 1:
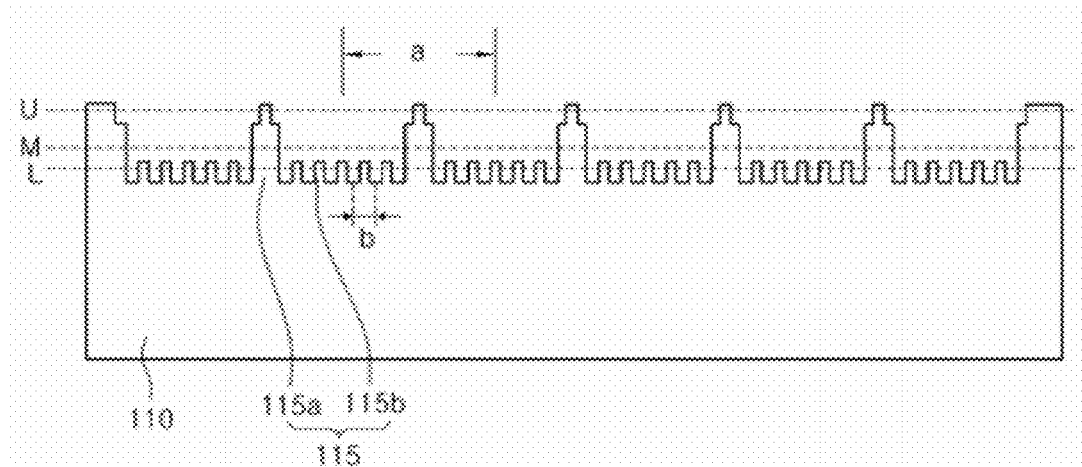
FIG. 1 is a vertical sectional view of a mixed-period photonic crystal structure of a light emitting device (LED) according to an embodiment.
Figure 2:
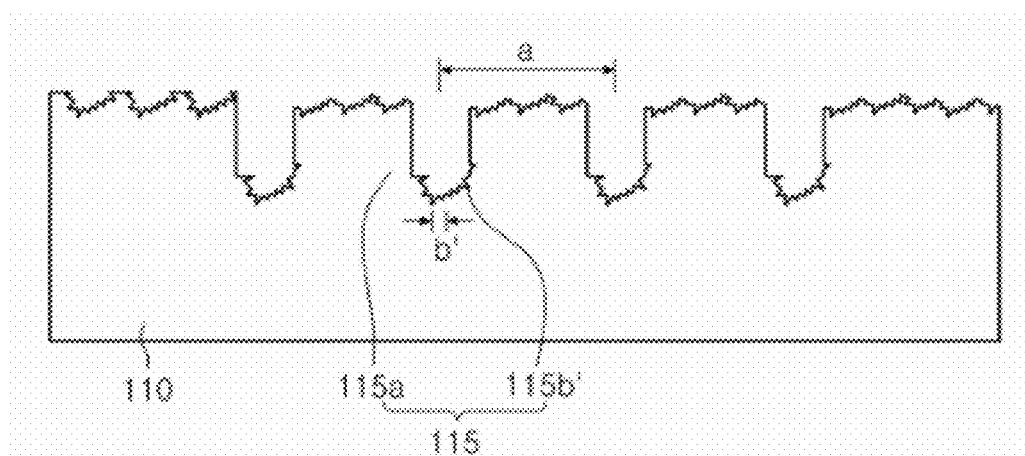
FIG. 2 is a vertical sectional view of a mixed-period photonic crystal structure of an LED according to another embodiment
Figure 3:
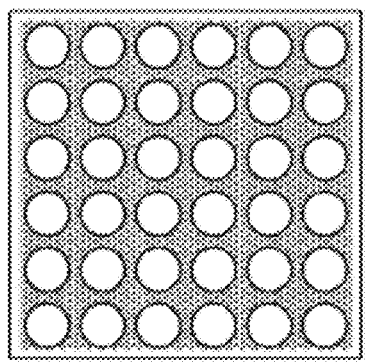
FIGS. 3 to 5 are horizontal sectional views of the mixed-period photonic crystal structure of the LED according to the embodiment of FIG. 1.
Figure 4:
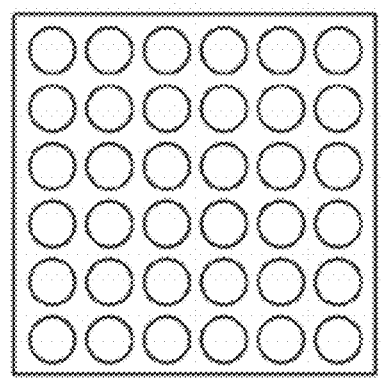
Figure 5:
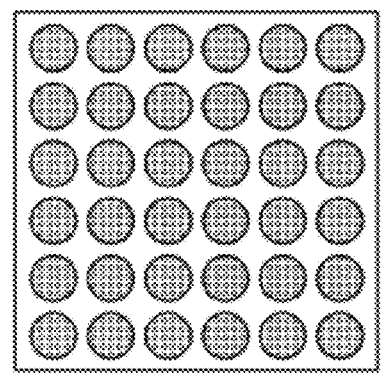

FIG. 1 is a vertical sectional view of a mixed-period photonic crystal structure of a light emitting device (LED) according to an embodiment. FIGS. 3 to 5 are horizontal sectional views of the mixed-period photonic crystal structure of the LED according to the embodiment of FIG. 1. FIG. 1 shows an example where a second photonic crystal structure 115b of the mixed-period photonic crystal structure has a uniform second period b. FIG. 2 shows another example where a second photonic crystal structure 115b' of the mixed-period photonic crystal structure has a non-uniform second period b'. Hereinafter, a description will be focused on the mixed-period photonic crystal structure of FIG. 1, to which the embodiment is not limited.

The mixed-period photonic crystal structure can be a structure where a first photonic crystal structure with a large period is filled with a second photonic crystal structure with a small period. Such a mixed-period photonic crystal structure is very difficult to implement through a lithography process.

The surface roughness serves to extract the light confined in an LED by total reflection.

In the embodiment, when the roughness or hole of a surface has a spatial period, it is referred to as a photonic crystal. Structural factors representing the photonic crystal are closely related to a light extraction efficiency. Examples of the structural factors include a period, an etching depth, the radius of a hole, and the arrangement of lattices.

In particular, an incident angle providing an effective diffraction efficiency is determined according to the period of the photonic crystal. Therefore, a photonic crystal structure with mixed periods maintains a high diffraction efficiency for various incident angles in comparison with a photonic crystal structure with a single period, thus increasing the light extraction efficiency.

FIG. 1 shows a mixed-period photonic crystal structure 115 where a second photonic crystal structure 115b with a second period b of about 250 nm is disposed in the space of a first photonic crystal structure 115a with a first period a of about 1800 nm.

FIGS. 3 to 5 are horizontal sectional views of the mixed-period photonic crystal structure of the LED according to the embodiment of FIG. 1, which are taken along lines U (upper), M (middle) and L (lower) of FIG. 1 to reveal the characteristics of the mixed-period photonic crystal structure.

Figure 6:
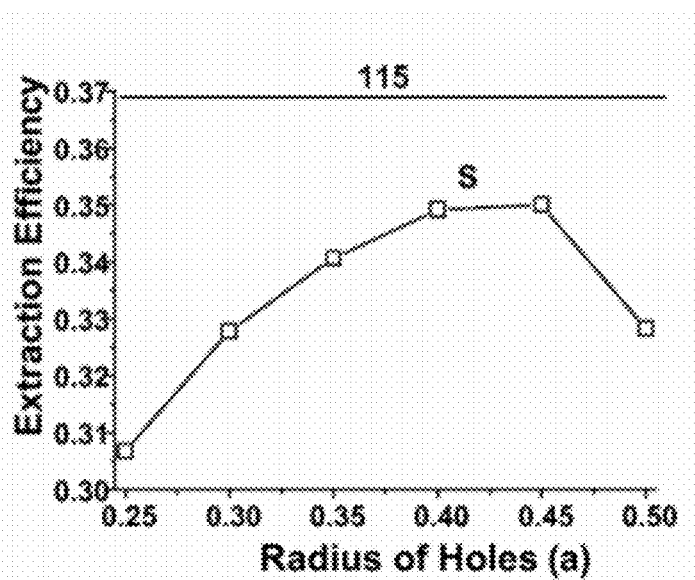
FIGS. 6 and 7 are graphs showing the light extraction efficiency of an LED according to an embodiment.
Figure 7:
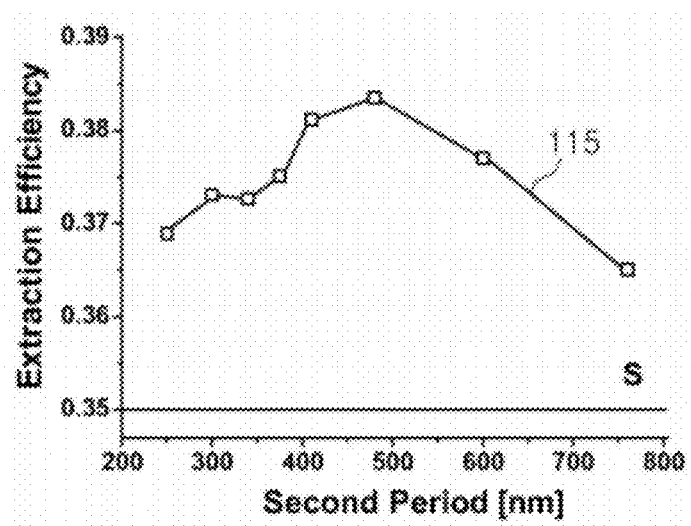

FIGS. 6 and 7 are graphs showing the light extraction efficiency of an LED according to an embodiment.

FIGS. 6 and 7 are simulation results showing that a mixed-period photonic crystal structure provides a better light extraction efficiency than a single-period photonic crystal structure.

Referring to FIG. 6, a line S represents the light extraction efficiency depending on the radius of a hole (unit: a) of a photonic crystal structure with a single period of 1800 nm, and a line 115 represents the light extraction efficiency of a mixed-period photonic crystal structure. The mixed photonic crystal structure 115 of FIG. 1 or 2 provides a better efficiency than the single-period photonic crystal structure S with a period of 1800 nm, regardless of the radius of a hole of the photonic crystal structure.

Referring to FIG. 7, a line 115 represents the light extraction efficiency depending on the period of a second photonic crystal structure with a second period when the second photonic crystal structure is introduced in a first photonic crystal structure with a first period of 1800 nm. In FIG. 7, the X axis represents the second period b of the second photonic crystal structure.

It can be seen from FIG. 7 that the extraction efficiency varies depending on the second period of the second photonic crystal structure. If the first period of the first photonic crystal structure is 1800 nm and the radius of a hole of the first photonic crystal structure is 0.40 a, the extraction efficiency varies depending on the second period of the second photonic crystal structure as shown in FIG. 7. Under the above conditions of the first photonic crystal structure, the second period of the second photonic crystal structure may have the maximum efficiency value within the range from about 300 nm to about 650 nm, to which the embodiment is not limited. That is, the second period of the second photonic crystal structure capable of providing the maximum efficiency may vary depending on the first period of the first photonic crystal structure and the radius of the hole.

In order to fabricate a mixed-period photonic crystal structure, the space of a first photonic crystal structure with a first period must be filled with a second photonic crystal structure with a second period smaller than the first period. This is difficult to implement through a lithography process. The embodiment provides a method for fabricating a mixed-period photonic crystal structure by forming a first photonic crystal structure through a lithography process and a dry etching process and forming a second photonic crystal structure through a wet etching process.

FIGS. 8 to 14 are sectional views showing a method for fabricating an LED according to an embodiment 1.

Figure 8:
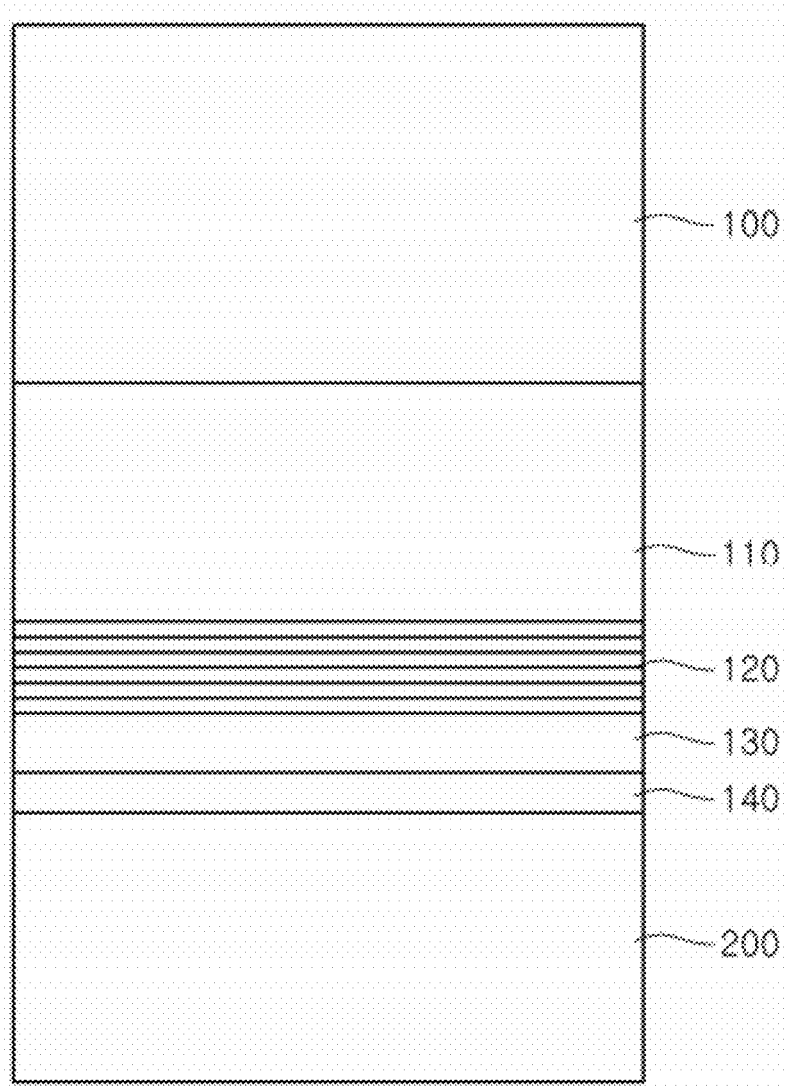
FIGS. 8 to 14 are sectional views showing a method for fabricating an LED according to an embodiment 1.

Referring to FIG. 8, a light emitting structure including a first conductivity type semiconductor layer 110, an active layer 120, and a second conductivity type semiconductor layer 130 can be formed on a first substrate 100.

The first substrate 100 may be a sapphire ($Al_2O_3$) substrate, to which the embodiment is not limited. A wet cleaning process may be performed to remove the impurities of the surface of the first substrate 100.

A first conductivity type semiconductor layer 110 can be formed on the first substrate 100. For example, a chemical vapor deposition (CVD) process, a molecular beam epitaxy (MBE) process, a sputtering process, or a hydride vapor phase epitaxy (HVPE) process may be used to form the first conductivity type semiconductor layer 110. Also, the first conductivity type semiconductor layer 110 may be formed by injecting tri-methyl gallium gas (TMGa), ammonia gas ($NH_3$), nitrogen gas ($N_2$), or silane gas ($SiH_4$) containing n-type impurity such as silicon (Si) into a process chamber.

An active layer 120 can be formed on the first conductivity type semiconductor layer 110. The active layer 120 emits a light of energy determined by the specific energy band of the active layer (light emitting layer) material when electrons injected through the first conductivity type semiconductor layer 110 recombine with holes injected through the second conductivity type semiconductor layer 130. The active layer 120 may have a quantum well structure that is formed by alternately laminating nitride semiconductor layers with different energy bands once or several times. For example, the active layer 120 may have a quantum well structure with an InGaN/GaN structure that is formed by injecting tri-methyl gallium gas (TMGa), ammonia gas ($NH_3$), nitrogen gas ($N_2$), or tri-methyl indium gas (TMIn), to which the embodiment is not limited.

A second conductivity type semiconductor layer 130 can be formed on the active layer 120. For example, the second conductivity type semiconductor layer 130 may be formed by injecting tri-methyl gallium gas (TMGa), ammonia gas ($NH_3$), nitrogen gas ($N_2$), or bisethylcyclopentadienyl magnesium (EtCp$_2$Mg){Mg($C_2H_5C_5H_4$)$_2$} containing p-type impurity such as magnesium (Mg) into a process chamber, to which the embodiment is not limited.

A second electrode layer 140 may be formed on the second conductivity type semiconductor layer 130. The second electrode layer 140 may include an ohmic contact layer, a reflection layer, a coupling layer, and a second substrate.

For example, the second electrode layer 140 may include an ohmic contact layer, and may be formed by laminating a single metal or a metal alloy several times in order to provide efficient hole injection. Also, the ohmic contact layer may include metal oxide material or metal material. For example, the ohmic contact layer may include at least one of ITO, IZO (In—ZnO), GZO (Ga—ZnO), AZO (Al—ZnO), AGZO (Al—Ga ZnO), IGZO (In—Ga ZnO), IrOx, RuOx, RuOx/ITO, Ni/IrOx/Au, and Ni/IrOx/Au/ITO, to which the embodiment is not limited.

Also, the second electrode layer 140 may include a reflection layer and/or a coupling layer. For example, if the second electrode layer 140 includes a reflection layer, the reflection layer may be formed of a metal layer containing aluminum (Al), argentum (Ag), or an Al or Ag-containing metal alloy. The Al or Ag effectively reflects the light generated from the active layer, thus making it possible to greatly improve the light extraction efficiency of the LED.

Also, for example, if the second electrode layer 140 can include a coupling layer, the reflection layer may serve as the coupling layer or the coupling layer may be formed using nickel (Ni) or aurum (Au).

Also, in the embodiment, the second electrode layer 140 may include a second substrate 200. If the first conductivity type semiconductor layer 110 has a sufficient thickness of about 50 µm or more, a process of forming the second substrate 200 may be omitted.

The second substrate 200 may be formed of highly conductive metal, metal alloy, or conductive semiconductor material in order to provide efficient hole injection. For example, the second substrate 200 may be formed of at least of one of copper (Cu), Cu alloy, Mo, carrier wafer such as Si, Ge, SiGe. The second substrate 200 may be formed using an electrochemical metal deposition process or a eutectic metal based bonding process.

Figure 9:
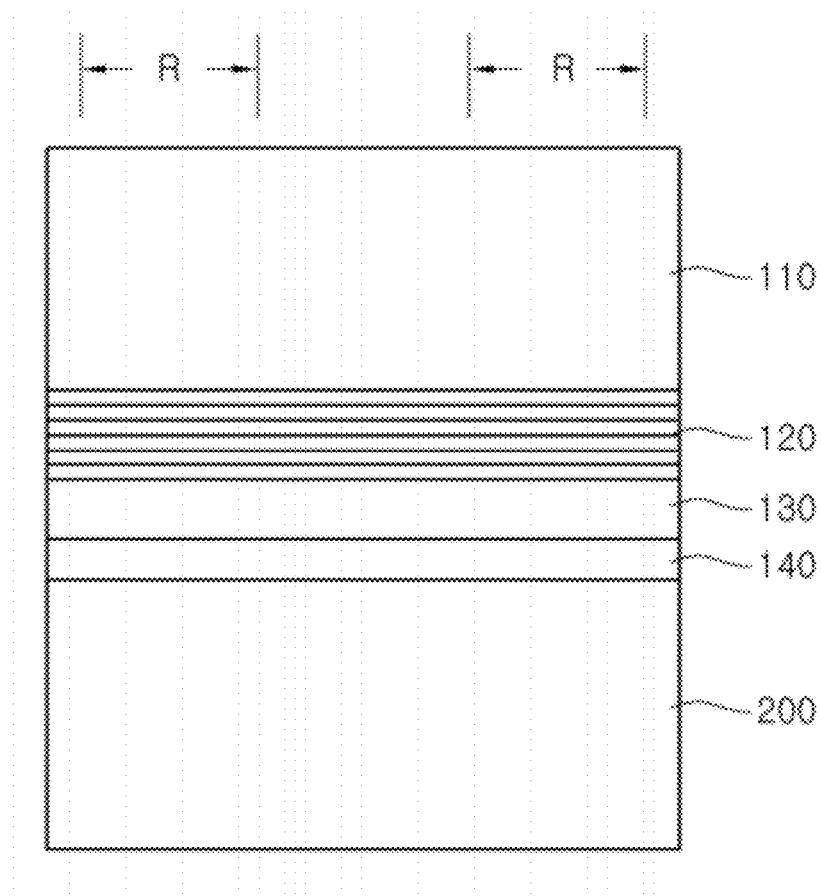

Referring to FIG. 9, the first substrate 100 can be removed to expose the first conductivity type semiconductor layer 110.

The first substrate 100 may be removed using a high-power laser lift-off process or a chemical etching process. Also, the first substrate 100 may be removed using a physical grinding process. The removal of the first substrate 100 exposes the first conductivity type semiconductor layer 110. The exposed first conductivity type semiconductor layer 110 may have a surface defect layer generated when the first substrate 100 is removed. The surface defect layer may be removed through a wet etching process or a dry etching process.

A mixed-period photonic crystal structure can be formed in a partial region R of the exposed first conductivity type semiconductor layer 110. The partial region R of the first conductivity type semiconductor layer 110 may be formed around a first electrode to be formed later.

If a rough surface is applied to an electrode in fabrication of a device based on a mixed-period photonic crystal structure (i.e., a surface roughness), it causes an additional optical loss. According to the embodiment, a mixed-period photonic crystal structure may be formed in a certain region R and an electrode region may be maintained to be planar, as shown in FIG. 9.

Hereinafter, with reference to FIGS. 10 to 12, a detailed description will be given of a process for forming a mixed-period photonic crystal structure in a certain region R of the first conductivity type semiconductor layer 110.

Figure 10:
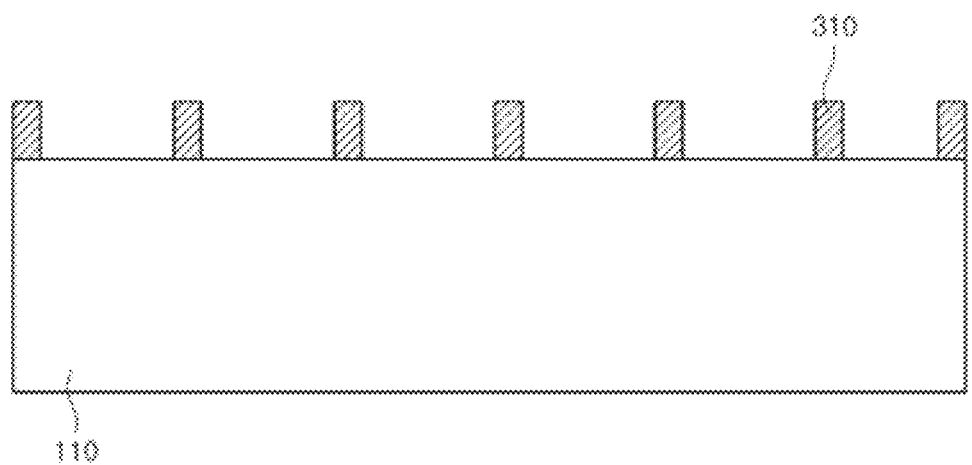

Referring to FIG. 10, a first pattern 310 can be formed in a partial region of the exposed first conductivity type semiconductor layer 110. The first pattern 310 can serve as a mask used for a dry etching process. The first pattern 310 may be formed of dielectrics (e.g., $SiO_2$ and $Si_3N_4$) or metals (e.g., Cr and Ni), which may be materials that do not react with basic solution (e.g., KOH or NaOH) used for wet etching of n-type GaN in the subsequent process.

Figure 11:
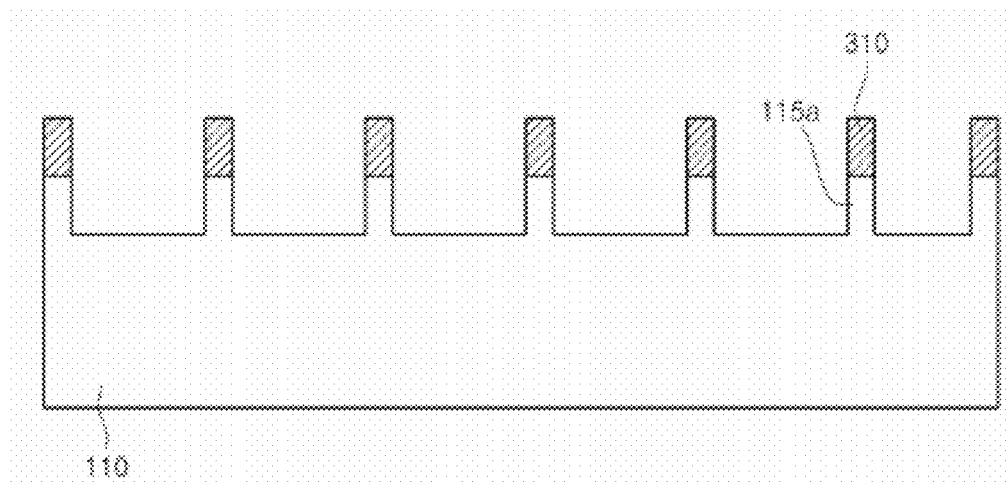

Referring to FIG. 11, using the first pattern 310 as a mask, the partial region R of the first conductivity type semiconductor layer 110 can be dry-etched to form a first photonic crystal structure 115a with a first period. The first period may be about 400 nm to about 3,000 nm, to which the embodiment is not limited.

Figure 12:
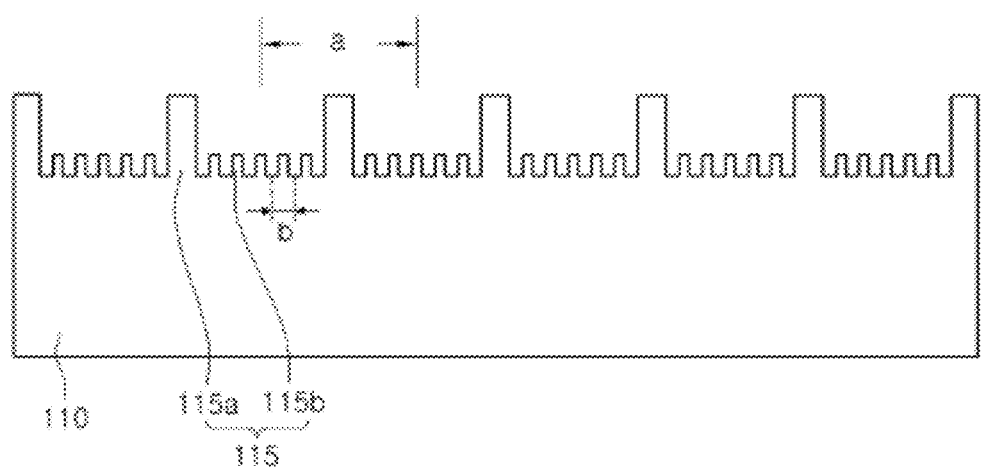

Referring to FIG. 12, using the first pattern 310 as a mask, a wet etching process may be performed to form a second photonic crystal structure 115b with a second period in the partial region of the first conductivity type semiconductor layer 110 having the first photonic crystal structure 115a formed therein. The second period may be smaller than the first period. For example, if the first period is about 400 nm to about 3,000 nm, the second period may be about 100 nm to about 800 nm.

When the wet etching process is performed after the dry etching without removing the first pattern mask, a roughness can be formed on a surface not covered with the first pattern mask and the height of a hole (or pillar) is further increased.

In the embodiment, the second photonic crystal structure may be formed to have a non-uniform second period as shown in FIG. 2.

Figure 13:
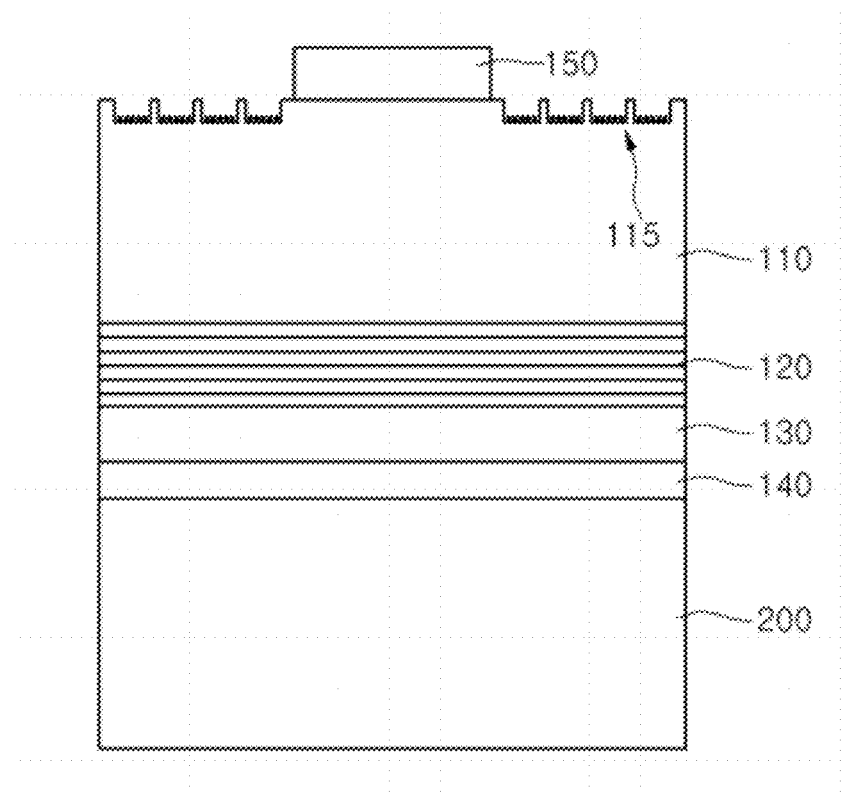

Referring to FIG. 13, a first electrode layer 150 can be formed in the region of the first conductivity type semiconductor layer 110, except the region of the mixed-period photonic crystal structure 115. The first electrode layer 150 may include an ohmic layer, a reflection layer, and a coupling layer.

Figure 14:
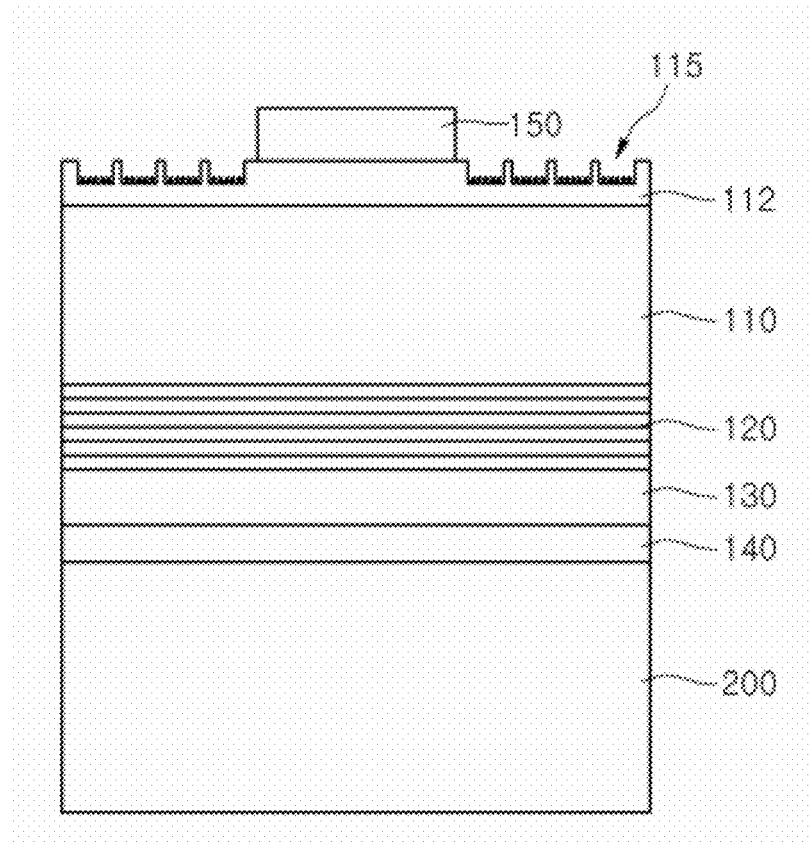

FIG. 14 is a sectional view of an LED according to an embodiment 1. Referring to FIG. 14, an undoped semiconductor layer 112 may be further included on a first conductivity type semiconductor layer 110, and a photonic crystal structure 115 may be formed on the undoped semiconductor layer 112. For example, an undoped GaN layer 112 may be formed on a first conductivity type semiconductor layer 110, and a photonic crystal structure 115 may be formed on the undoped GaN layer 112.

Embodiment 2

Figure 15:
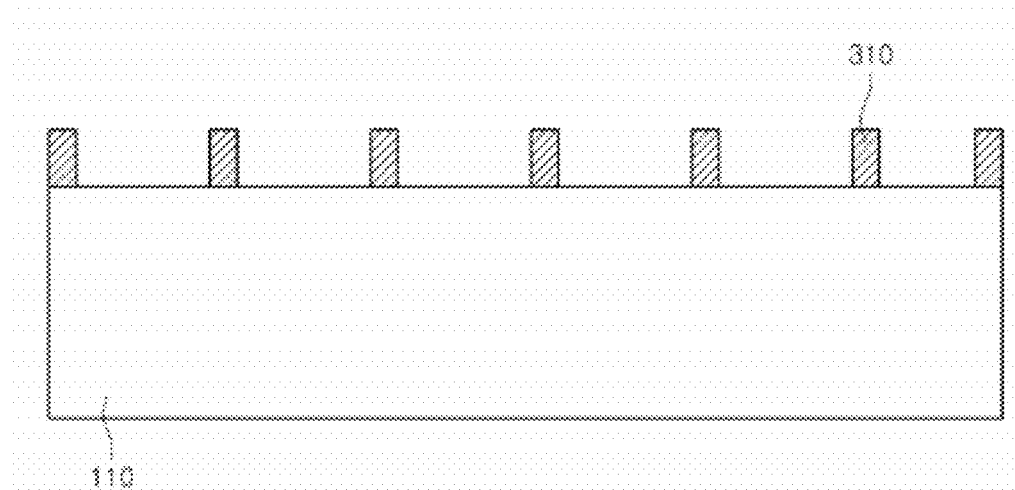
FIGS. 15 to 17 are sectional views showing a method for fabricating an LED according to an embodiment 2.
Figure 16:
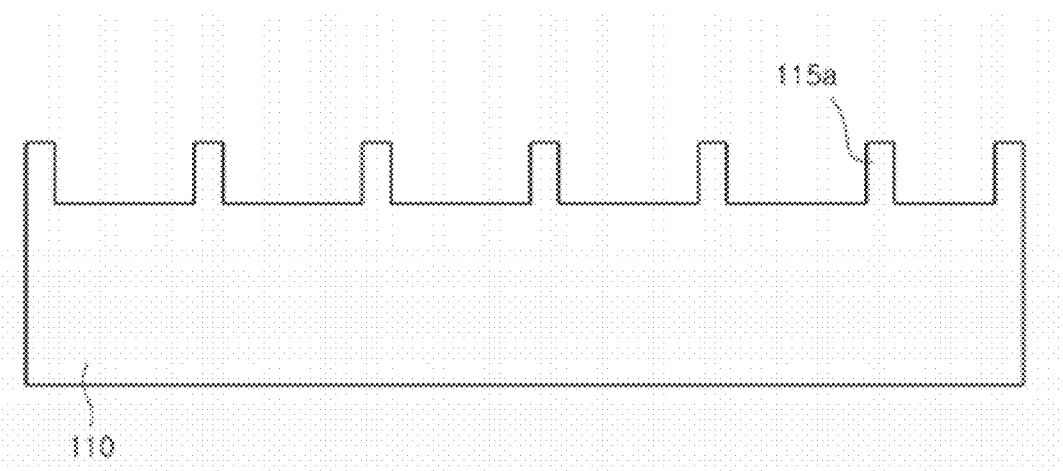
Figure 17:
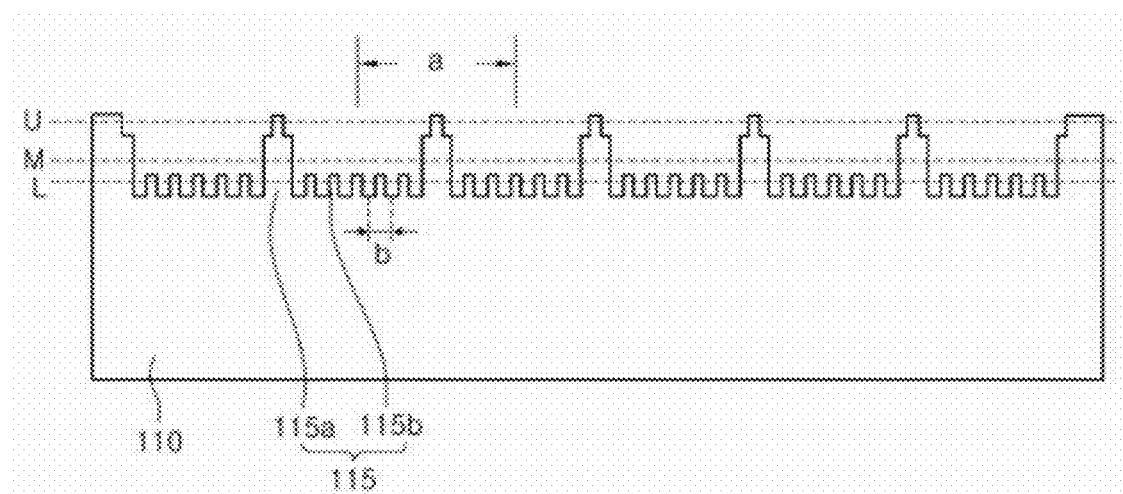

FIGS. 15 to 17 are sectional views showing a method for fabricating an LED according to an embodiment 2.

Unlike the embodiment 1, the embodiment 2 can remove a first pattern 310 and performs a wet etching process. Referring to FIG. 15, a first pattern 310 can be formed in a partial region of the first conductivity type semiconductor layer 110. Referring to FIG. 16, using the first pattern 310 as a mask, the partial region of the first conductivity type semiconductor layer 110 can be dry-etched to form a first photonic crystal structure 115a with a first period. Referring to FIG. 17, after the first pattern 310 is removed, a second photonic crystal structure 115b with a second period b can be formed in the partial region of the first conductivity type semiconductor layer 110 having the first photonic crystal structure 115a formed therein. In the embodiment 2, the second photonic crystal structure may be formed also on the surface of the first photonic crystal structure 115a.

The second period b may be smaller than the first period. For example, if the first period is about 400 nm to about 3,000 nm, the second period may be about 100 nm to about 800 nm.

Even if the mask of the first pattern 310 is removed and a wet etching process is performed as shown in FIG. 16, the wet etching of the N-type GaN mounting the first pattern 310 can be somewhat delayed. The reason for this is that Ga ions accumulated during the removal of the sapphire substrate by a laser lift-off process interrupts the wet etching process. Thus, even if the first pattern mask is removed, a surface roughness (a third photonic crystal) with a size of about 100 nm to about 300 nm may be formed at several points of the photonic crystal surface. That is, a photonic crystal structure the third photonic crystal) formed on the first photonic crystal structure 115a corresponding to the first pattern 310 may have a finer second period than the second photonic crystal structure formed between the first photonic crystal structures 115a. The first photonic crystal structure 115a may have a concave region and a convex region. The second photonic crystal structure 115b can be formed on a bottom surface of the concave region of the first photonic crystal structure 115a and the third photonic crystal structure can be formed on an upper surface of the convex region of the first photonic crystal structure 115a.

A mixed-period photonic crystal structure 115 may be completed by the method of the embodiment 1 or 2. The GaN surface supporting the mask of the first pattern 310 delays the wet etching process, thereby forming a roughness of a finer second period (a third period) with a size of about 100 nm to about 300 nm. Therefore, through the wet etching process, the surface roughness covers the entire photonic crystal region, thus improving the light extraction efficiency.

Figure 18:
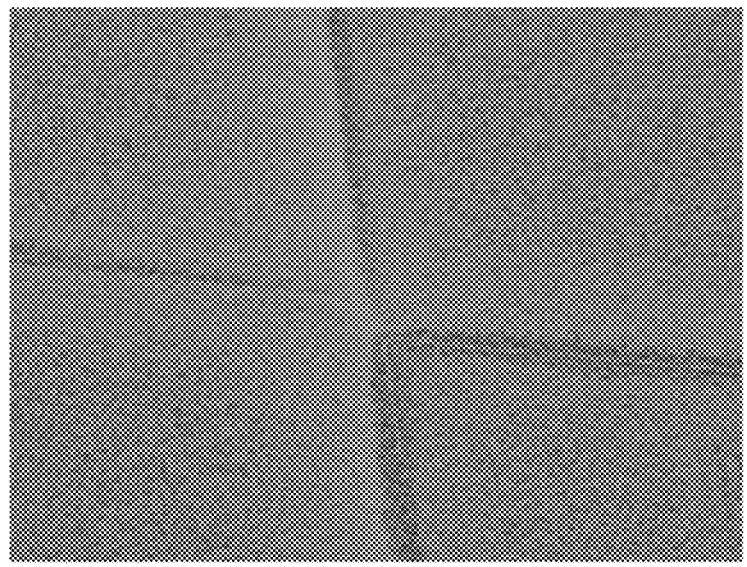
FIGS. 18 and 19 are the GaN electron microscope surface pictures when a wet etching process is performed immediately after removal of a substrate.
Figure 19:
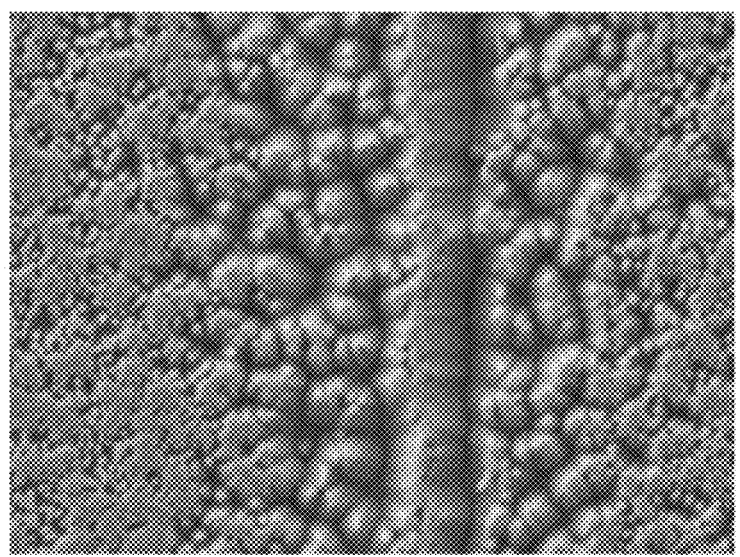
Figure 20:
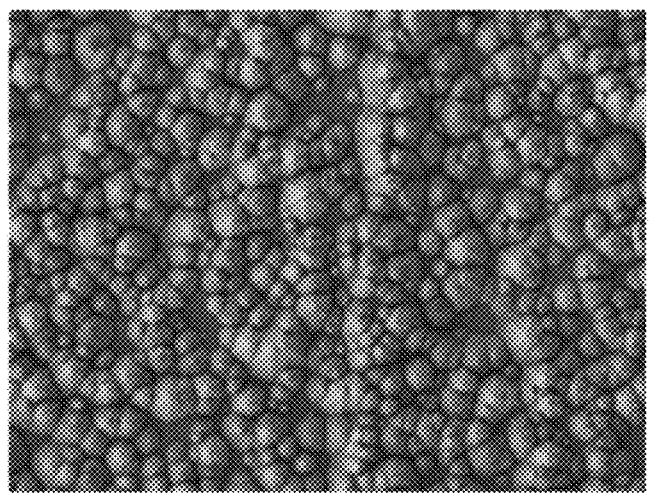
FIGS. 20 and 21 are GaN electron microscope surface pictures when a wet etching process is performed after a dry etching process for a portion of the GaN surface.
Figure 21:
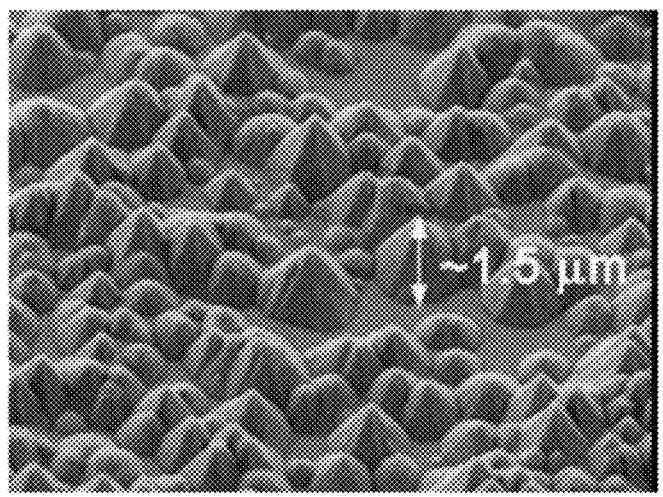

FIGS. 18 and 19 are the GaN electron microscope surface pictures when a wet etching process is performed immediately after removal of a sapphire substrate, for example, a laser lift-off process. FIGS. 20 and 21 are the GaN electron microscope surface pictures when a wet etching process is performed after a dry etching process for a portion of the GaN surface.

For example, in the case of a vertical type GaN LED structure as in the embodiments 1 and 2, a wet etching process can be performed on an n-type GaN layer 110 or an undoped-GaN layer 112 from which a sapphire substrate is removed. If a wet etching process performed after removal of a substrate as shown in FIGS. 18 and 19, a wet etching process is not actively performed, except a fine surface roughness, excluding a laser lift-off line.

On the other hand, if a wet etching process is performed after Ga ions on the GaN surface are removed through a dry etching process as shown in FIGS. 20 and 21, a roughness shape with suitable sizes is uniformly formed on the surface, as can be seen from the electron microscope pictures.

Figure 22:
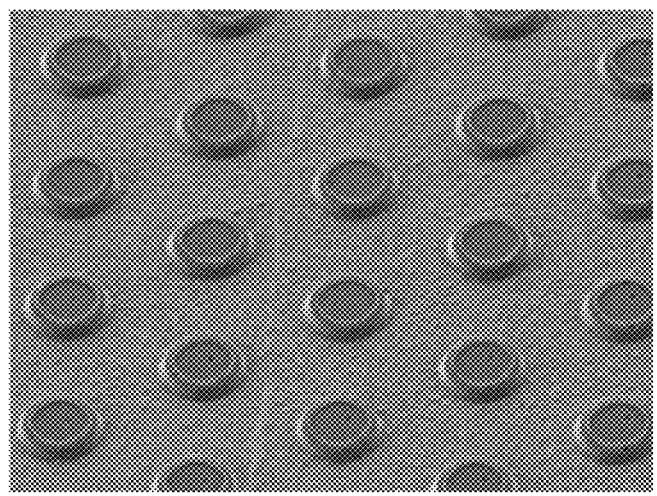
FIGS. 22 and 23 are electron microscope surface pictures when a dry etching process is performed using an etch mask and a wet etching process is performed after removal of the etch mask.
Figure 23:
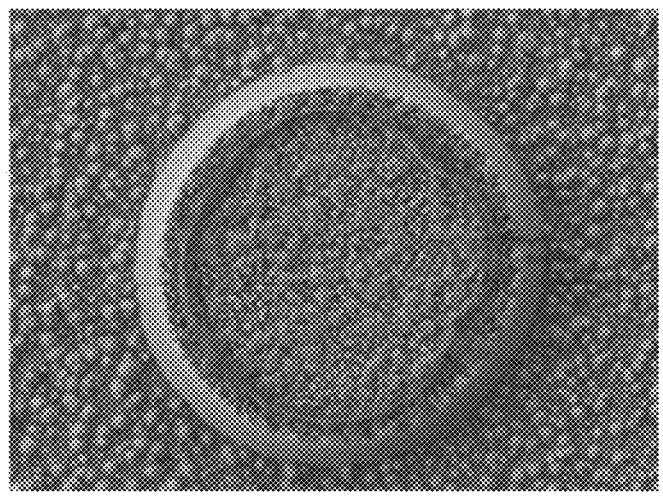

FIGS. 22 and 23 are the electron microscope surface pictures when a dry etching process is performed using an etch mask and a wet etching process is performed after removal of the etch mask.

According to the embodiment, a fine surface roughness fills the entire photonic crystal space as shown in FIGS. 22 and 23. In no case, the photonic crystal structure is destroyed or covered by the surface roughness, due to a difference in the wet etching reaction depending on the exposure to the dry etching process.

According to the embodiment, a first photonic crystal is formed through a lithography process and a dry etching process and a second photonic crystal is formed through a wet etching process to fabricate a mixed-period photonic crystal structure.

Also, the mixed-period photonic crystal structure can increase the light extraction efficiency. That is, the mixed-period photonic crystal structure according to the embodiment can provide better light extraction efficiency characteristics than a single-period photonic crystal structure or a light extraction structure with surface roughness.

Embodiment 3

Figure 24:
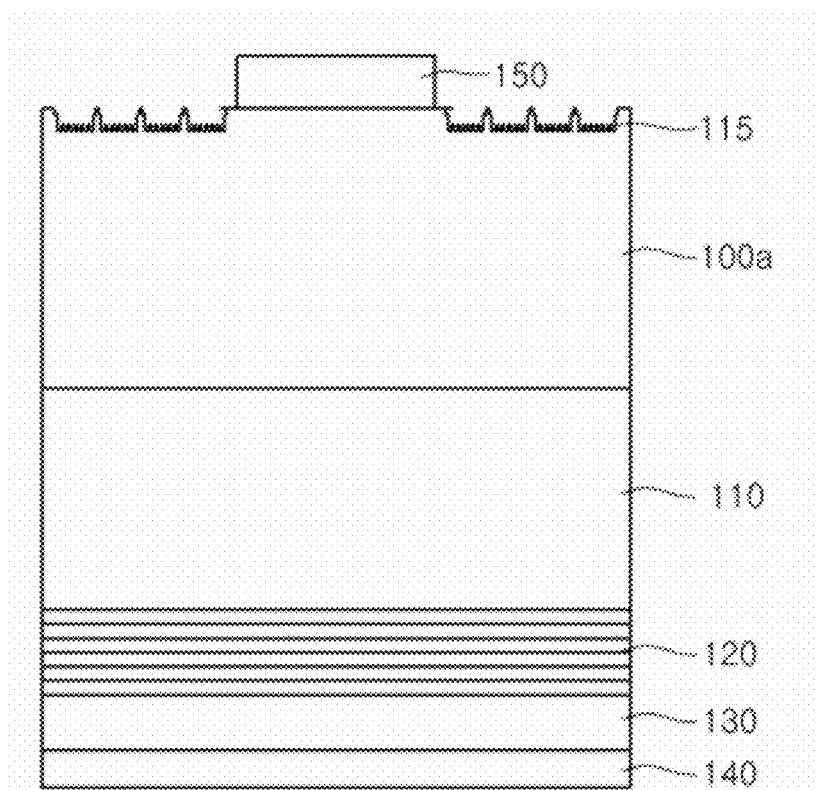
FIG. 24 is a sectional view of an LED according to an embodiment 3.

FIG. 24 is a sectional view of an LED according to an embodiment 3.

Referring to FIG. 24, an LED according to an embodiment 3 may include: a light emitting structure including a second conductivity type semiconductor layer 130, an active layer 120, and a first conductivity type semiconductor layer 110; a conductive substrate 100a formed on the light emitting structure; and a mixed-period photonic crystal structure 115 formed in a partial region of the conductive substrate 100a.

The embodiment 3 may use the technical features of the embodiments 1 and 2. The embodiment 3 can be a vertical type LED structure where a light emitting structure including a first conductivity type semiconductor layer 110, an active layer 120, and a second conductivity type semiconductor layer 140 is formed on a conductive substrate 110a, wherein the substrate need not be removed during the fabrication process.

That is, the embodiment 3 can use a conductive substrate and forms a mixed-period photonic crystal structure 115 on a portion of the conductive substrate.

A method for fabricating an LED according to the embodiment 3 will be described with reference to FIG. 24. A description of an overlap with the embodiments 1 and 2 will be omitted for conciseness.

Referring to FIG. 24, a conductive substrate 100a is prepared. The conductive substrate 100a can be high in electric conductivity and can be transparent in the range of visible rays. The conductive substrate 100a may be formed of gallium nitride (e.g., GaN), gallium oxide (e.g., $Ga_2O_3$), zinc oxide (ZnO), silicon carbide (SiC), or metal oxide.

Like the embodiments 1 and 2, a light emitting structure including a first conductivity type semiconductor layer 110, an active layer 120, and a second conductivity type semiconductor layer 140 is formed on the conductive substrate 100a.

A portion of the bottom of the conductive substrate 100a can be removed. For example, a polishing process may be performed to reduce the thickness of the bottom layer of the conductive substrate 100a. The thickness of the conductive substrate 100a after the polishing process may vary according to the application product of a desired device. For example, the conductive substrate 100a with a thickness of about 400 µm to about 500 µm can be polished to a thickness of about 70 µm to about 100 µm, to which the embodiment is not limited.

When a nitride semiconductor thin layer can be formed on the conductive substrate 100a at high temperatures by means of a thin layer growth equipment, the surface crystal quality of the bottom surface of the conductive substrate 100a may degrade due to high thin layer growth temperatures and reactive gases. Thus, polishing the bottom layer of the conductive substrate 100a can improve the electrical characteristics of the device.

Like the embodiment 1 or 2, a mixed-period photonic crystal structure 115 may be formed in a partial region of the conductive substrate 100a.

A first electrode 150 may be formed in the remaining region of the conductive substrate 100a, except the partial region having the mixed-period photonic crystal structure 115 formed therein.

Embodiment 4

Figure 25:
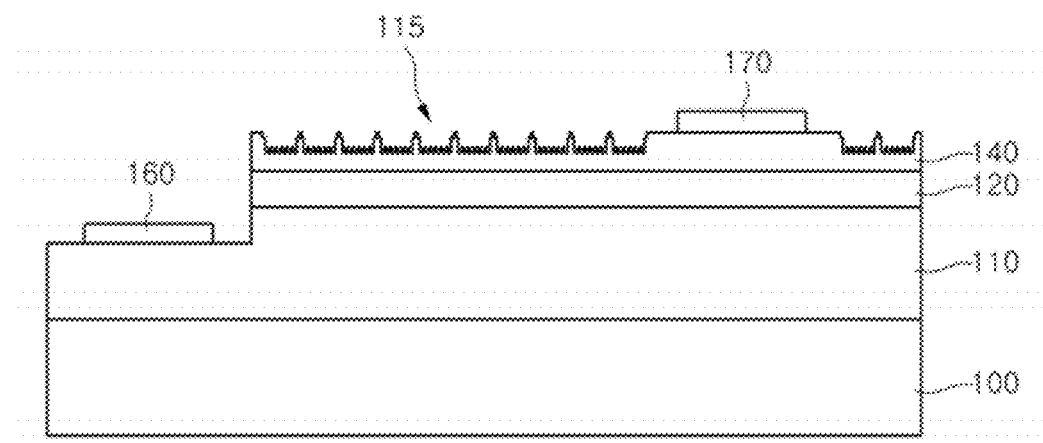
FIG. 25 is a sectional view of an LED according to an embodiment 4.

FIG. 25 is a sectional view of an LED according to an embodiment 4.

Referring to FIG. 25, an LED according to an embodiment 4 may include: a nonconductive substrate 100; a light emitting structure formed on the nonconductive substrate 100 and including a first conductivity type semiconductor layer 110, an active layer 120, and a second conductivity type semiconductor layer 140; and a mixed-period photonic crystal structure 115 formed in a partial region of the second conductivity type semiconductor layer 140. A second electrode 170 may be formed on the second conductivity type semiconductor layer 140, and a first electrode 160 may be formed on the first conductivity type semiconductor layer 110.

The embodiment 4 may use the technical features of the embodiments 1 to 3. The embodiment 4 can have a horizontal type LED structure and may include a mixed-period photonic crystal structure 115 on the second conductivity type semiconductor layer 140.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for fabricating a light emitting device (LED), comprising:
    forming a light emitting structure on a sapphire substrate, wherein the light emitting structure comprises a first conductivity type semiconductor layer having Ga material and Nitride material on the sapphire substrate, an active layer on the first conductivity type semiconductor layer, and a second conductivity type semiconductor layer on the active layer; and
    removing the sapphire substrate from the first conductivity type semiconductor layer by a laser lift-off process;
    forming a mixed-period photonic crystal structure on the first conductivity type semiconductor layer after the removing of the sapphire substrate;
    wherein the forming of the mixed-period photonic crystal structure comprises forming a first, a second, and a third photonic crystal structures having respective a first, a second, and a third periods,
    wherein the first photonic crystal structure is formed by a dry etching process using a first pattern on the first conductivity type semiconductor layer,
    wherein the second photonic crystal structure and the third photonic crystal structure are formed by a wet etching process after removing the first pattern,
    wherein the first photonic crystal structure comprises a concave region and a convex region,
    wherein the second photonic crystal structure is formed on the concave region of the first photonic crystal structure,
    wherein the third photonic crystal structure is formed on the convex region of the first photonic crystal structure, and
    wherein the Ga material is accumulated at a top surface of the first conductivity type semiconductor layer during the removing of the sapphire substrate by the laser lift-off process to interrupt the wet etching process.

2. The method of claim 1, wherein the mixed-period photonic crystal structure of the LED comprises:
    the first photonic crystal structure having the first period in a partial region of the first conductivity type semiconductor layer; and
    the second photonic crystal structure having the second period in the partial region of the first conductivity type semiconductor layer that includes the first photonic crystal structure.

3. The method of claim 2, wherein the second period is smaller than the first period.

4. The method of claim 3, wherein the second period is non-uniform.

5. The method of claim 3, wherein the second period is about 100 nm to about 800 nm.

6. The method of claim 2, wherein the first period is about 400 nm to about 3,000 nm.

7. The method of claim 1, wherein the third photonic crystal structure is on a top surface of the first photonic crystal structure.

8. The method of claim 1, wherein the second photonic crystal structure and the third photonic crystal structure are formed at the same time through the wet etching process.

9. The method of claim 1, wherein the third period of the third photonic crystal structure is finer than the second period of the second photonic crystal structure.

10. The method of claim 1, wherein the second period of the second photonic crystal structure is finer than the first period of the first photonic crystal structure, and
    wherein the third period of the third photonic crystal structure is finer than the second period of the second photonic crystal structure.

* * * * *